US008779011B2

(12) United States Patent
Mahulikar et al.

(10) Patent No.: US 8,779,011 B2
(45) Date of Patent: *Jul. 15, 2014

(54) ULTRAPURE COLLOIDAL SILICA FOR USE IN CHEMICAL MECHANICAL POLISHING APPLICATIONS

(75) Inventors: Deepak Mahulikar, Madison, CT (US); Yuhu Wang, Santa Rosa, CA (US); Ken A. Delbridge, Chandler, AZ (US); Gert R. M. Moyaerts, Phoenix, AZ (US); Saeed H. Mohseni, Sylvania, OH (US); Nichole R. Koontz, Mesa, AZ (US); Bin Hu, Chandler, AZ (US); Liqing Wen, Mesa, AZ (US)

(73) Assignee: Fujifilm Planar Solutions, LLC, Adrian, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/405,027

(22) Filed: Feb. 24, 2012

(65) Prior Publication Data

US 2012/0145950 A1 Jun. 14, 2012

Related U.S. Application Data

(63) Continuation of application No. 11/526,132, filed on Sep. 22, 2006, now Pat. No. 8,211,193.

(60) Provisional application No. 60/720,611, filed on Sep. 26, 2005.

(51) Int. Cl.
*C01B 33/141* (2006.01)
*C01B 33/143* (2006.01)
*C09C 1/68* (2006.01)
*C09K 13/06* (2006.01)

(52) U.S. Cl.
USPC .................. 516/81; 516/83; 516/84; 51/308; 252/79.1

(58) Field of Classification Search
USPC ......... 51/308; 423/336, 338, 339; 516/81, 83, 516/84; 252/79.1
See application file for complete search history.

(56) References Cited

U.S. PATENT DOCUMENTS

| | | | |
|---|---|---|---|
| 3,947,376 A | | 3/1976 | Albrecht |
| 5,063,179 A | * | 11/1991 | Menashi et al. ............... 501/12 |
| 5,168,928 A | | 12/1992 | Terry et al. |
| 5,527,423 A | | 6/1996 | Neville et al. |
| 5,904,159 A | * | 5/1999 | Kato et al. ......................... 134/7 |
| 6,062,952 A | | 5/2000 | Robinson et al. |
| 6,248,144 B1 | * | 6/2001 | Tamai et al. ..................... 51/308 |
| 6,340,374 B1 | | 1/2002 | Kato et al. |
| 6,372,806 B1 | | 4/2002 | Keiser et al. |
| 6,626,967 B2 | | 9/2003 | Takami et al. |
| 6,849,099 B2 | | 2/2005 | Ohno et al. |
| 6,906,109 B2 | | 6/2005 | Paszkowski |
| 6,924,016 B2 | | 8/2005 | Wanat et al. |
| 6,979,252 B1 | | 12/2005 | Siddiqui et al. |
| 8,211,193 B2 | * | 7/2012 | Mahulikar et al. ............... 51/308 |
| 2001/0006224 A1 | | 7/2001 | Tsuchiya et al. |
| 2002/0016275 A1 | | 2/2002 | Yano et al. |
| 2003/0064671 A1 | | 4/2003 | Pasqualoni et al. |
| 2003/0115805 A1 | | 6/2003 | Rosenflanz et al. |
| 2004/0235396 A1 | | 11/2004 | Hattori et al. |
| 2004/0250476 A1 | | 12/2004 | Ohno et al. |
| 2005/0108949 A1 | * | 5/2005 | Matsuda et al. ................ 51/308 |
| 2005/0129603 A1 | * | 6/2005 | Szillat et al. ................. 423/335 |
| 2005/0139803 A1 | | 6/2005 | Uno et al. |
| 2005/0191823 A1 | * | 9/2005 | Horikawa et al. ............. 438/424 |
| 2005/0205837 A1 | | 9/2005 | Miwa |
| 2006/0124593 A1 | | 6/2006 | Moyaerts et al. |
| 2006/0283095 A1 | | 12/2006 | Mahulikar et al. |

FOREIGN PATENT DOCUMENTS

| | | |
|---|---|---|
| CN | 1640974 A | 7/2005 |
| CN | 1670115 A | 9/2005 |
| JP | 2001026771 | 1/2001 |
| JP | 20011294417 | 10/2001 |
| JP | 2002012854 | 1/2002 |
| JP | 20033218069 | 7/2003 |
| JP | 2004123880 | 4/2004 |
| JP | 2004349426 | 12/2004 |
| JP | 2005158970 | 6/2005 |
| JP | 2005244123 | 9/2005 |
| JP | 2008523638 | 7/2008 |
| KR | 20040056167 | 6/2004 |

OTHER PUBLICATIONS

Japanese Office Action dated Aug. 22, 2012 for Japanese application No. 2008-533465.
Notice of Result of Re-Examination prior to Appeal Trail dated May 24, 2010 for Korean application No. 10-2008-7010231, Korean Intellectual property Office (KIPO).
Notice of Decision to Rejection dated Mar. 5, 2010 for Korean application No. 10-2008-7010231, Korean Intellectual property Office (KIPO).

(Continued)

*Primary Examiner* — Daniel S Metzmaier
(74) *Attorney, Agent, or Firm* — Ohlandt, Greeley, Ruggiero & Perle, LLP

(57) ABSTRACT

A method for producing and using an ultrapure colloidal silica dispersion is disclosed. The ultrapure colloidal silica dispersion has less than 200 ppb of each trace metal impurity disposed therein, excluding potassium and sodium, and less than 2 ppm residual alcohol. The method comprises dissolving a fumed silica in an aqueous solvent comprising an alkali metal hydroxide to produce an alkaline silicate solution, removing the alkali metal via ion exchange to generate a silicic acid solution, adjusting temperature, concentration and pH of said silicic acid solution to values sufficient to initiate nucleation and particle growth, and cooling the silicic acid solution at a rate sufficient to produce the colloidal silica dispersion.

7 Claims, 11 Drawing Sheets

(56) References Cited

OTHER PUBLICATIONS

Notice of Preliminary Rejection dated Nov. 9, 2009 for Korean application No. 10-2008-7010231, Korean Intellectual Property Office (KIPO).

Taiwanese Office Action (with English translation) dated November Oct. 29, 2012 for Taiwanese application No. 95135541.

Kazusei Tamal; "Ceramics"; Fujimi Incorporated; 1998, 33; No. 1; pp. 30-34.

* cited by examiner

ULTRAPURE COLLOIDAL SILICA FOR USE IN CHEMICAL MECHANICAL POLISHING APPLICATIONS

CROSS-REFERENCE TO RELATED APPLICATIONS

This application is a continuation of U.S. patent application Ser. No. 11/526,132, filed on Sep. 22, 2006, now U.S. Pat. No. 8,211,193 B2, which in turn claims priority from U.S. Provisional Application Ser. No. 60/720,611, filed on Sep. 26, 2005.

BACKGROUND OF THE DISCLOSURE

1. Field of the Disclosure

The present invention relates to a method of manufacturing of an ultrapure colloidal silica dispersion and slurry thereof. More particularly, the present invention relates to a method of chemical mechanical polishing (CMP) the surface of a substrate using such ultrapure colloidal silica prepared according to the present invention.

2. Description of Related Art

The most common process for the preparation of colloidal silica in industry is to prepare colloidal silica particles from water glass made by fusion of natural silica sands with sodium carbonate at temperature less than 1200° C. After fusion, the fused sodium silicate is quenched and completely dissolved in water, forming water glass that is highly caustic. To process colloidal silica, the water glass is further passed through a strong acidic resin bed or column for ion exchange and converted into silicic acid. The silicic acid, normally around pH 2-3, is then placed in a container, the pH adjusted to about 8 using alkali for stabilization, and then heated to an elevated temperature, 80-100° C. for particle formation.

Depending upon the processing condition, the particle size distribution of the final product can be manipulated and controlled to be from 5 nm to about 100 nm or less. Because of the nature of the raw material, silica sands, however, the final colloidal silica from this process has more or less trace metals, such as Fe, Al, and Na, from 100 ppm to 1000 ppm or less.

Although ion exchange can remove certain amount of trace metals, impurities lower than 100 ppm is very difficult to achieve with this process even using the highest quality of natural $SiO_2$ (see, for example, "The Chemistry of Silica," by Ralph K. Iler, John Wiley & Sons, Inc., Ed. (1979), and U.S. Pat. No. 3,947,376).

Another approach which leads to very high purity colloidal silica is by the sol-gel process. In this process, a high purity alkoxide, such as, tetramethoxy silane (TMOS) or tetraethoxy silane (TEOS), are used as the raw material. TMOS or TEOS is dissolved is in methanol or ethanol first and then mixed with deionized (DI) water for hydrolysis, with $NH_4OH$ used as the catalyst.

After the colloidal silica is formed, the solution is heated to a high temperature so that the ammonia and the organic solvent can be removed by evaporation (W. Stober, et al., J. Colloid Interface Sci., 26, 62 (1968)). The colloidal silica so processed has a very high purity because of the high purity of the raw materials.

However, this approach has several drawbacks. One is that the colloidal silica from this process is much more expensive because of the highly expensive raw materials. Secondly, large quantity of impure methanol or ethanol will be generated which is not environmental friendly. Finally, the colloidal silica can have high level of ammonia and organic solvent residual, which can be very undesirable for chemical mechanical polishing (CMP) applications.

Colloidal silica comes in different sizes and shapes. The main benefit of colloidal silica over fumed silica is that they can generate very small particles, as small as 5 to 10 nm. Also colloidal silica can be well dispersed to the primary spherical particles while fumed silica particles are always aggregated. In the area of chemical mechanical polishing (CMP), this translates to very low defectivity and high removal rates on certain metals.

Most colloidal silicas, however, are quite impure. The commercially available Ludox colloidal silica from Grace has trace metals in double digit ppm ranges. Trace metals can cause killer defectivity. This makes it unacceptable for chemical mechanical polishing (CMP) application.

Highly pure colloidal silicas can be made from TEOS or TMOS. However, these types of silica are very expensive because it requires pure raw materials and a complex manufacturing process and it generates significant amount of waste. For example, 3 parts of TEOS generates approximately 1 part of silica and two parts of impure ethanol (TEOS is composed of 28% SiO2-72% EtOH).

The fumed silicas are generally quite pure. These are solid particles ranging from 75 to 300 nm mean particle size (MPS) with primary particles size around 20 to 40 nm. But unlike colloidal silica (which are solution grown) they have to be made into chemical mechanical polishing (CMP) slurries by high shear grinding process using water, wetting and stabilizing agents. In addition these dispersions need filtration to remove large particles. Thus, although the fumed silica is low to moderate in cost, the final dispersion can be relatively expensive. Other issue with the fumed silica is they cause high CMP defectivity In commonly assigned copending U.S. patent application Ser. No. 11/152,873, filed on Jun. 15, 2005, now United States Patent Application Publication No. 2007/001485 A1, which is incorporated herein in its entirety, still yet another process is disclosed to produce highly pure colloidal silica dispersion. This method includes the steps of dissolving a fumed silica in an aqueous solvent containing an alkali metal hydroxide to produce an alkaline silicate solution, such as, a potassium silicate solution; removing the majority of alkali ions via ion exchange to produce a silicic acid solution; adjusting the temperature, concentration and pH of the silicic acid solution to values sufficient to initiate nucleation and particle growth; and cooling the silicic acid solution sufficiently to produce the colloidal silica dispersion. The colloidal silica particles in the colloidal silica dispersion have a primary particle size about 2 nm to about 100 nm, and a mean particle size (MPS) of 20 to 200 nm.

Semiconductor manufacturing processes, in general, use high purity chemicals, such as hydrogen peroxide, HF, TMAF, and the like. This is needed because certain impurities can affect the yield of the IC devices dramatically.

The CMP process, however, presents a different story. This is because for the 130 and 90 nm devices the amount of impurities left on the wafer surface after post-CMP cleaning is considered a critical factor. Thus a good post-CMP cleaning could is remove most particles and impurities for those nodes. Thus, the impurity needs for slurries are not as stringent as other electronic chemicals. Very impure colloidal silica (e.g., Na, Al, Ca B, etc in high levels) was used for polishing of oxide layers in these nodes especially the 130 nm node.

For the 65 nm and below nodes, however, the requirements are changing dramatically. These nodes involve complex structures including Low K and ULK materials and caps. A variety of defects that were non-critical (or tolerable) for 130 nm nodes became critical killer defects. Corrosion and Fangs are 2 examples. Fangs, or seam etching at the interface between Ta and Cu at the trenches, is acceptable up to certain level for 130 nm node. For 65 nm node more than 100A fangs are unacceptable. Very low defectivity, especially scratches, also means very careful particle size and Large Particles Count (LPC) control. Impurities can have a strong influence on defectivity.

The following is a list of impurities with known or potentially damaging effects on wafers:

(1) Electrical effects: Mobile ions, such as, Na and K;
(2) Corrosion of Cu causing opens or shorts: Halides, such as, F, Cl, Br, and I, and sulfates;
(3) Fangs: solvents, alcohols, and amines; and
(4) Scratches: Al, Fe, abrasive compounds, such as, zirconia, and alumina.

In addition to these, there are indirect effects of impurities. Cross contamination is one. For example in a Cu CMP process, if step 1 has some Cl ion in the slurry, it can contaminate the step 2 slurry and change the polish performance. It should be noted that many commercial Cu and barrier slurries are relatively pure having trace metals at less than 1 ppm level.

It is an object of the present invention to solve the purity related issues by making is slurries which are ultra pure, i.e., less than 200 ppb of each individual trace metal, alcohol, ammonia, certain cations, and anions, such as, Cl and F.

SUMMARY OF THE DISCLOSURE

The present invention provides a method of chemical mechanical polishing a surface of a substrate. The method includes the step of:

contacting a substrate; and a composition which includes:
(i) a plurality of colloidal silica particles having less than 200 ppb of each trace metal impurity, excluding potassium and sodium, have less than 2 ppm residual alcohol and wherein the cumulative trace metal concentration, excluding potassium and sodium, is in the range from about 0.5 to about 5 ppm; and
(ii) a medium for suspending the particles;
wherein the composition is an ultrapure colloidal silica dispersion; and wherein the contacting is carried out at a temperature and for a period of time sufficient to planarize the substrate.

The present invention further provides a ultrapure colloidal silica dispersion including colloidal silica particles having a mean or aggregate particle size from about 10 to about 200 nm, wherein the colloidal silica dispersion has less than 200 ppb of each trace metal impurity disposed therein, excluding potassium and sodium, and have less than 2 ppm residual alcohol.

The present invention still further provides a method of manufacturing an ultrapure colloidal silica dispersion, including the steps of:

dissolving a fumed silica in an aqueous solvent containing an alkali metal hydroxide to produce an alkaline silicate solution;

removing majority of the alkali metal via ion exchange to produce a silicic acid solution;

adjusting temperature, concentration and pH of the silicic acid solution to values sufficient to initiate nucleation and particle growth; and cooling the silicic acid solution to produce the colloidal silica dispersion.

The present invention also provides a method of chemical mechanical polishing a surface of a substrate including the step of:

contacting the substrate and an ultrapure colloidal silica dispersion including colloidal silica particles having a mean or aggregate particle size from about 10 to about 200 nm, and wherein the colloidal silica dispersion has less than 200 ppb of each trace metal impurity, excluding potassium and sodium, and have less than 2 ppm residual alcohol;

wherein the contacting is carried out at a temperature and for a period of time sufficient to planarize the substrate.

The present invention additionally provides a potassium silicate solution having less than 200 ppb of each trace metal impurity disposed therein, excluding K and Na, and less than 2 ppm residual alcohol.

These and other aspects and benefits of the present methods and will become more apparent from the detailed description of the preferred embodiments that follows.

DETAILED DESCRIPTION OF THE DISCLOSURE

Figure 1:
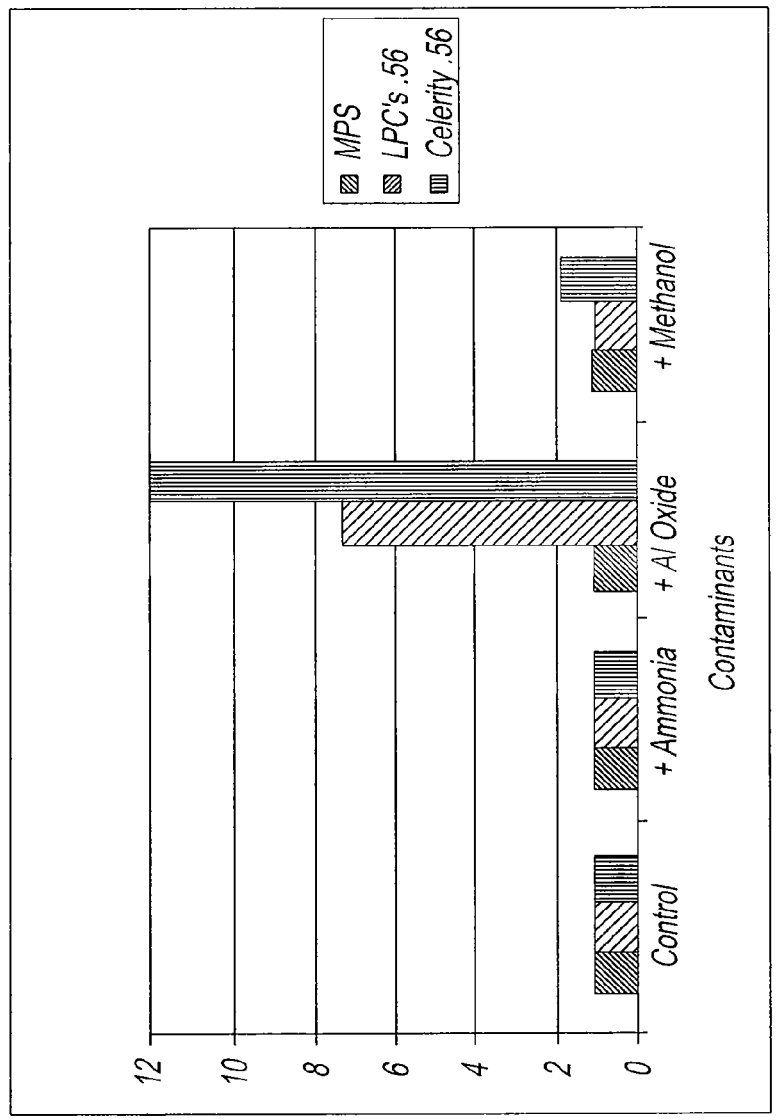
FIG. 1 is a graph plotting normalized data for Cu10K-SPF with contaminants.

Chemical mechanical polishing slurries containing less than about 200 ppb of each individual trace metal impurity, and alcohols, more particularly about 5 to about 200 ppb of each individual trace metal or alcohol, excluding sodium, which may be present in an amount of less than 1 ppm. Moreover, the cumulative amount of trace metal impurities present in such ultrapure slurries according to the present invention is in the range from about 0.5 to about 5 ppm, more preferably from about 1 to about 3 ppm. Such ultrapure slurries exhibit novel removal rates with a decrease in defects. Such slurries may optionally include a stabilizer ion, such as, potassium.

The colloidal silica particles are from about 0.2 wt % to about 45 wt % of the total weight of the composition, more preferably from about 2 wt % to about 24 wt %. The colloidal silica particles have a surface area from about 20 m$^2$/g to about 300 m$^2$/g.

The composition further includes a surfactant selected from anionic, cationic, non-ionic and amphoteric surfactants and a mixture thereof. The surfactant is an alkoxylated non-ionic surfactant.

The composition further includes at least one additive selected from carboxylic acid, at a concentration of about 0.01 wt % to about 0.9 wt %; oxidizer, at a concentration of about 10 ppm to about 2.5%, more preferably from about 10 ppm to about 2500 ppm; and corrosion inhibitor, at a concentration of about 10 ppm to about 1000 ppm.

The composition is in a form selected from an emulsion, colloidal suspension, solution and slurry. The medium is from about 1 wt % to about 86 wt % of the total weight of the composition. The medium has a pH bout 2 to about 11. The medium is selected from water, an organic solvent and a mixture thereof.

The colloidal silica dispersion is used as the chemical mechanical polishing composition without isolating the colloidal silica particles from the colloidal silica dispersion. Preferably, the alkali metal hydroxide is potassium hydroxide.

The colloidal silica particles are prepared by dissolving a fumed silica in an aqueous solvent including an alkali metal hydroxide to produce a alkaline silicate solution, removing the alkali metal via ion exchange to convert the alkaline silicate solution to a silicic acid solution, adjusting temperature, concentration and pH of the silicic acid solution to values sufficient to initiate nucleation and particle growth, and cooling the silicic acid solution at a rate sufficient to produce a colloidal silica dispersion; and isolating the colloidal silica particles from the colloidal silica dispersion to produce colloidal silica particles having a mean or aggregate particle size about 10 nm to about 200 nm and metals selected from Li, Rb, Cs, Fr, Fe, Al, and any combinations thereof, at a total metals concentration of about 10 ppm or less.

The trace metal is present within the dispersion in the range from about 5 to about 200 ppb, excluding sodium which may be present in an amount of less than 1 ppm. Moreover, the cumulative trace metal concentration of the dispersion, excluding potassium, is in the range from about 1 to 5 ppm, more preferably about 1 to about 3 ppm.

According to an embodiment of the present invention, the chemical mechanical polishing slurry contains less than 200 ppb of amines, such as, ammonia.

The present invention provides a method of manufacturing a colloidal silica dispersion, including the steps of: dissolving a fumed silica in an aqueous solvent containing an alkali metal hydroxide to produce an alkaline silicate solution; removing majority of the alkali metal via ion exchange to produce a silicic acid solution, adjusting temperature, concentration and pH of the silicic acid solution to values sufficient to initiate nucleation and particle growth; and cooling the silicic acid solution to produce the colloidal silica dispersion.

The colloidal silica particles can be isolated from the colloidal silica dispersion to produce solvent free colloidal silica particles. However, the dispersion is typically used "as is" or by adding other ingredients, such as, organic solvents, additives and surfactants to produce a composition that is suitable for use for chemical mechanical polishing of surfaces of a substrate.

The colloidal silica dispersion can be concentrated from the original colloidal silica dispersion either by removing the aqueous solvent or, more preferably, by filtering the colloidal silica particles, and thereafter drying.

The colloidal silica particles prepared by the method of the present invention have a mean or aggregate particle size (MPS) about 10 nm to about 200 nm.

Preferably, the colloidal silica particles have a total metals concentration of about 300 ppm or less. The metals can be Li, Rb, Cs, Fr, Fe, Al, or any combinations thereof. More preferably, the concentration of these metals is about 10 ppm or less.

In the practice of the method of the present invention, fumed silica starting material is dissolved in an aqueous solvent, such as, an aqueous alkali, alcohol, or a combination thereof, to produce an alkali silicate solution. Then, majority of the alkali is removed by ion exchange so that the alkaline silicate solution is converted into a silicic acid solution.

The temperature, the concentration and the pH of this solution, which is a silicic acid solution, is then adjusted to values such that the selected values cause the solution to initiate nucleation and allow the nucleated particles to form the colloidal silica dispersion.

Preferably, the temperature of the silicic acid solution before the start of the nucleation is about 5° C. to about 40° C.

Preferably, the concentration of the silicic acid in the silicic acid solution before the start of the nucleation is about 2 wt % to about 30 wt % of the silicic acid solution.

Preferably, the pH of the silicic acid solution is about 1.5 to about 5, and more preferably from 1.5 to about 4.0.

Preferably, the cooling rate of the silicic acid solution is about 5° C./min to about 100° C./min.

The high purity colloidal silica dispersion made as set forth above is then admixed with semiconductor grade raw materials, e.g., hydrogen peroxide, BTA, KOH, organic acids, etc., to make a final slurry product having ultrapure purity.

The below examples show the results of our comparative studies between the ultrapure colloidal silica dispersion of the present invention versus convention lesser pure colloidal silica dispersions. These comparative studies demonstrate that tiny amounts of impurities can have a significant effect on removal rates, LPC's and defectivity. Ultra pure slurries have better overall performance than other slurries. The compositions used in the below examples are set forth below in Tables 1 and 2.

TABLE 1

Objective: Polishing for differences in Control SPF/ER8071 and contaminants Scrubber DI H2O only
Recipe:
Slurry

|  | Control SPF 142116 | SPF + 100 ppm Ammonia | SPF + 15 ppm Al Oxide | SPF + 150 ppm Methanol |
|---|---|---|---|---|
| Lot# | 1366-82A | 1366-82B | 1366-82C | 1366-82D |
| Wafer type: | Used Cu | Used Cu | Used Cu | Used Cu |
| Average (angstroms) | 1017 | 1152 | 1031 | 1024 |
| Defects counted: | 8 | 10 | 67 | 8 |
| Wafer type: | Used Ta | Used Ta | Used Ta | Used Ta |
| Removed (angstroms) | 668 | 703 | 734 | 736 |
| Wafer type: | Used TEOS | Used TEOS | Used TEOS | Used TEOS |
| Average A Removed | 1809 | 1821 | 1786 | 1773 |
| LPC's 0.56 | 1379 | 1237 | 9964 | 1252 |
| LPC's 1.01 | 320 | 243 | 457 | 211 |
| MPS Gaussian | 147.4 | 146.5 | 146.4 | 148.7 |
| C-0.56* | 3780 | 3560 | 70001 | 6718 |
| C01.0* | 395 | 546 | 35645 | 1942 |

*C is another Light scattering technique of measuring Large Particle Counts(LPCs)

TABLE 2

Objective: Polishing for differences in Control
SPF/ER8071 and contaminants
Scrubber DI H2O only
Recipe:
Slurry

|  | Control 8071 1366-83 | 8071 + 100 ppm Ammonia | 8071 + 15 ppm Al Oxide | 8071 + 150 ppm Methanol |
|---|---|---|---|---|
| Lot# | 1366-82A | 1366-82B | 1366-82C | 1366-82D |
| Wafer type: | Used Cu | Used Cu | Used Cu | Used Cu |
| Average (angstroms) | 36 | 78 | 71 | 171 |
| Defects counted: | 3 | 1 | 70 | 4 |
| Average Defects | 3 | 1 | 70 | 4 |
| Wafer type: | Used Ta | Used Ta | Used Ta | Used Ta |
| Removed (angstroms) | 678 | 671 | 663 | 661 |
| Wafer type: | Used TEOS | Used TEOS | Used TEOS | Used TEOS |
| Average A Removed | 713 | 725 | 708 | 715 |
| LPC's .56 | 2358 | 2884 | 44878 | 6883 |
| LPC's 1.01 | 309 | 320 | 20666 | 1358 |
| MPS Gaussian | 66.8 | 66.6 | 66.2 | 66.1 |
| C-0.56 | 10247 | 9277 | 425314 | 12288 |
| C-1.0 | 1722 | 1389 | 219690 | 5829 |

Example 1

The present inventors mixed some contaminants into Cu10K-SPF (i.e., a commercial barrier layer polishing slurry manufactured and sold by Planar Solutions Inc., which includes 10% fumed silica, KOH, a corrosion inhibitor and hydrogen peroxide as an oxidizer and ER8071, i.e., an experimental barrier layer slurry with 6.75% ultra pure colloidal silica particles, KOH, a corrosion inhibitor, a surfactant and hydrogen peroxide. That is, the present inventors used the ultrapure colloidal silica dispersion made by the aforementioned manufacturing process. In addition, the present inventors, used semiconductor grade raw materials, e.g., hydrogen peroxide or BTA (as a corrosion inhibitor) to make final slurry products.

For comparison purposes, two slurries were made, i.e., standard Cu10K-2 and an experimental barrier slurry ER8071, as control samples. Thereafter, the inventors is intentionally added several impurities, such as Al, Cl, ammonia, methanol, and the like, and measured LPC's and did polishing tests. Attached is the raw data for LPC's (Accusizer and Celerity), MPS, and polishing on a hard pad.

Figure 2:
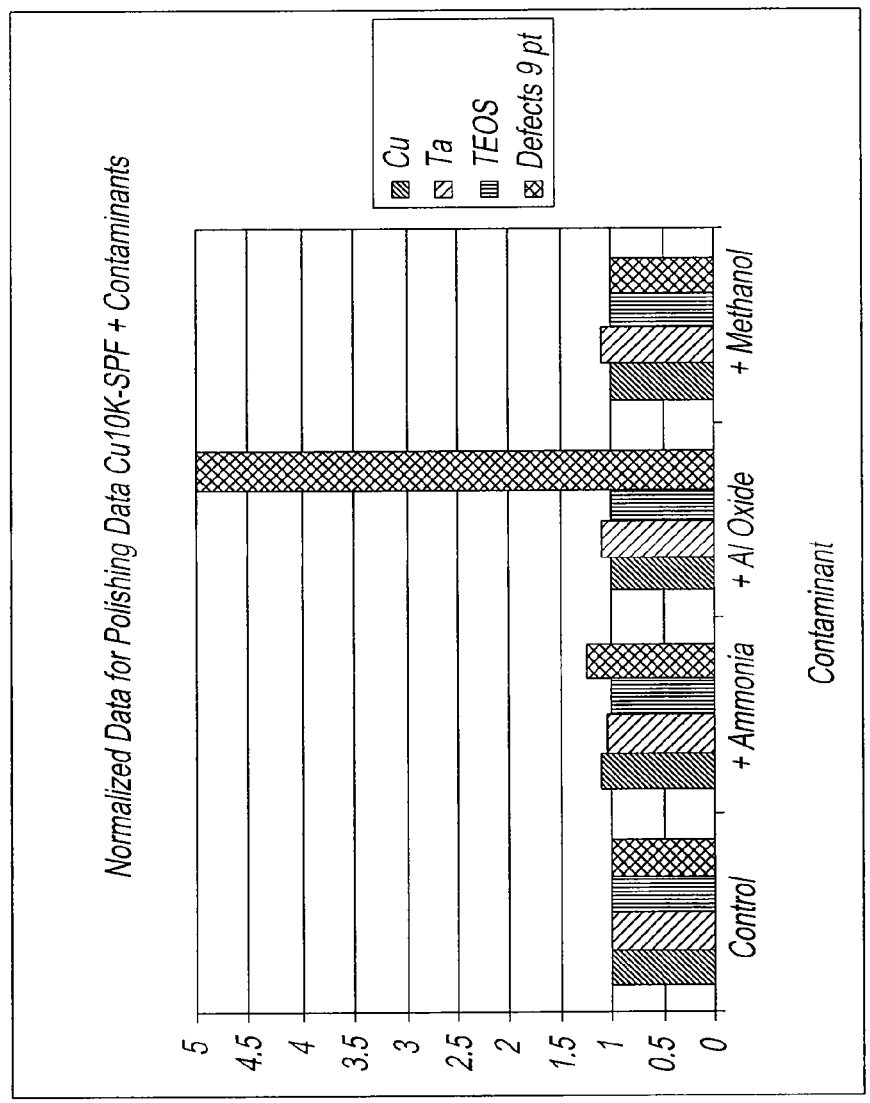
FIG. 2 is a graph plotting normalized data for polishing Cu10K-SPF with contaminants.

FIGS. 1 and 2, attached hereto, provide data when Cu10K-SPF was a control and wherein fixed amounts of ammonia (100 ppm), alumina (5 ppm) and methanol (150 ppm) were added and then various properties were tested. These tests demonstrated that ammonia increased copper removed rates and slightly increased defectivity. Also, alumina increased LPC's and defectivity dramatically. Furthermore, methanol increased the C LPC's (large particle counts) significantly.

Figure 3:
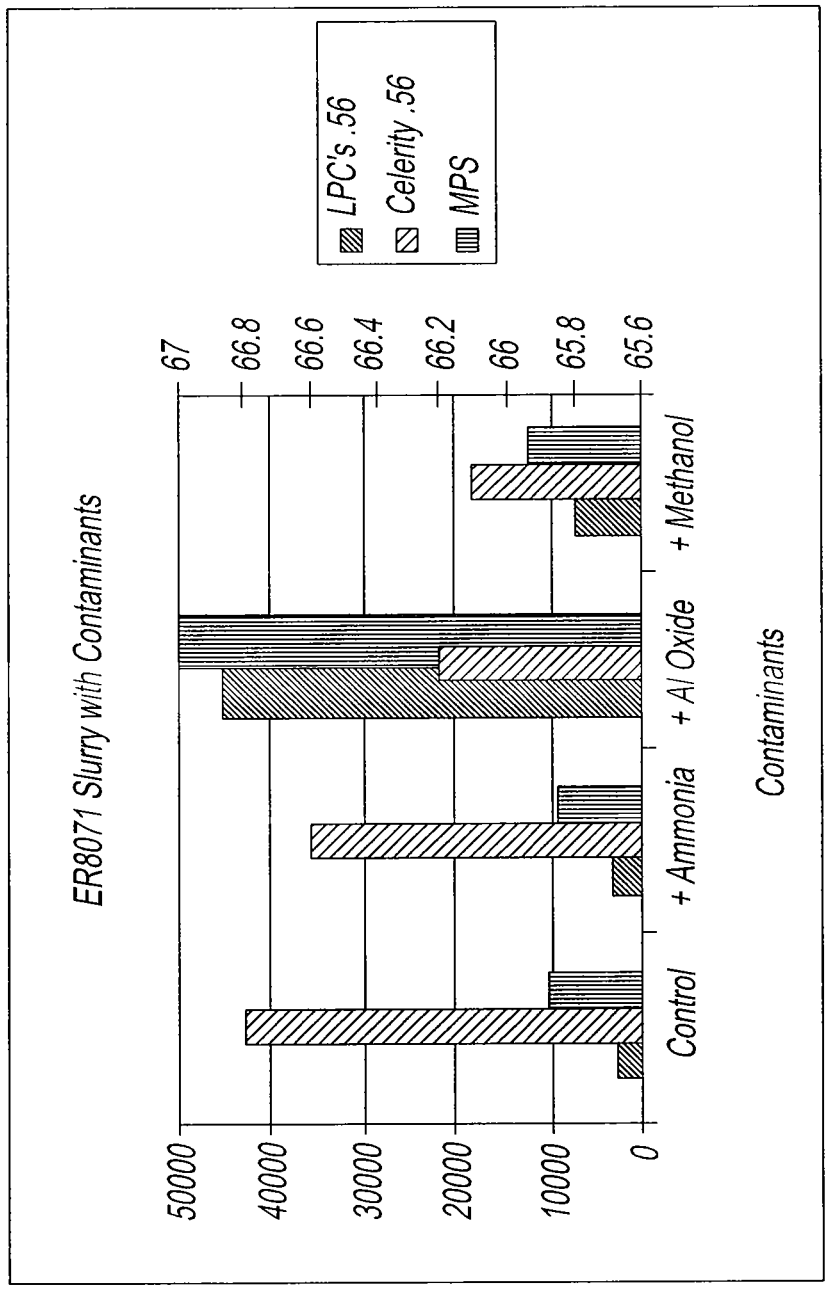
FIG. 3 is a graph plotting ER8071 Slurry with contaminants.
Figure 4:
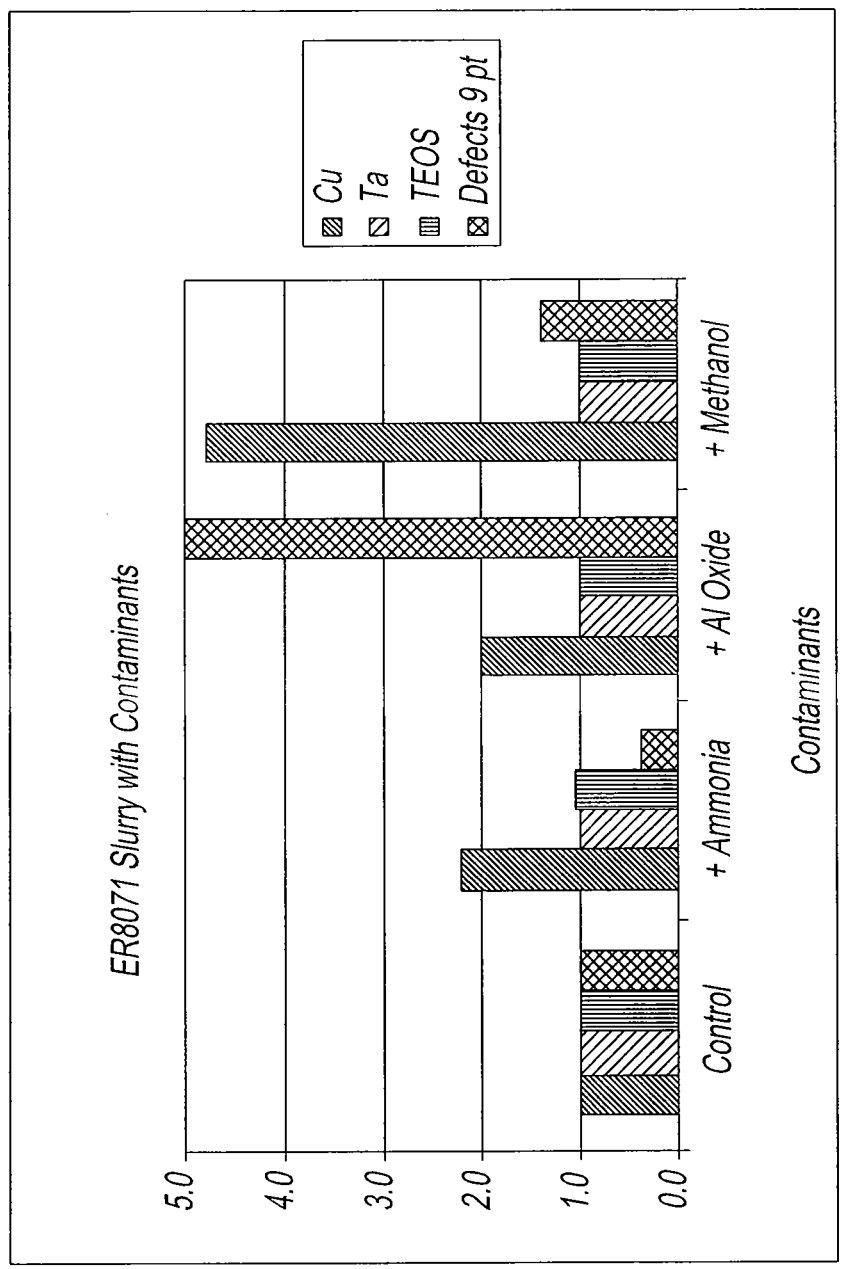
FIG. 4 is a graph plotting data for polishing ER8071 with contaminants.

FIGS. 3 and 4, attached hereto, provide data when ER8071 slurry was used and wherein fixed amounts of ammonia (100 ppm), alumina (5 ppm) and methanol (150 ppm) were added and then various properties were tested. These tests demonstrated that ammonia increased the copper removal rates. Alumina increased the LPC's and defectivity and methanol increased the defectivity and LPC's.

Example 2

FIG. 5-8 include data generated from a second screening of contaminants in both fumed silica and FCC particles. Aluminum oxide from Example 1 was replaced with aluminum chloride, as well as the colloidal silica particle was replaced with FCC particles.

Figure 5:
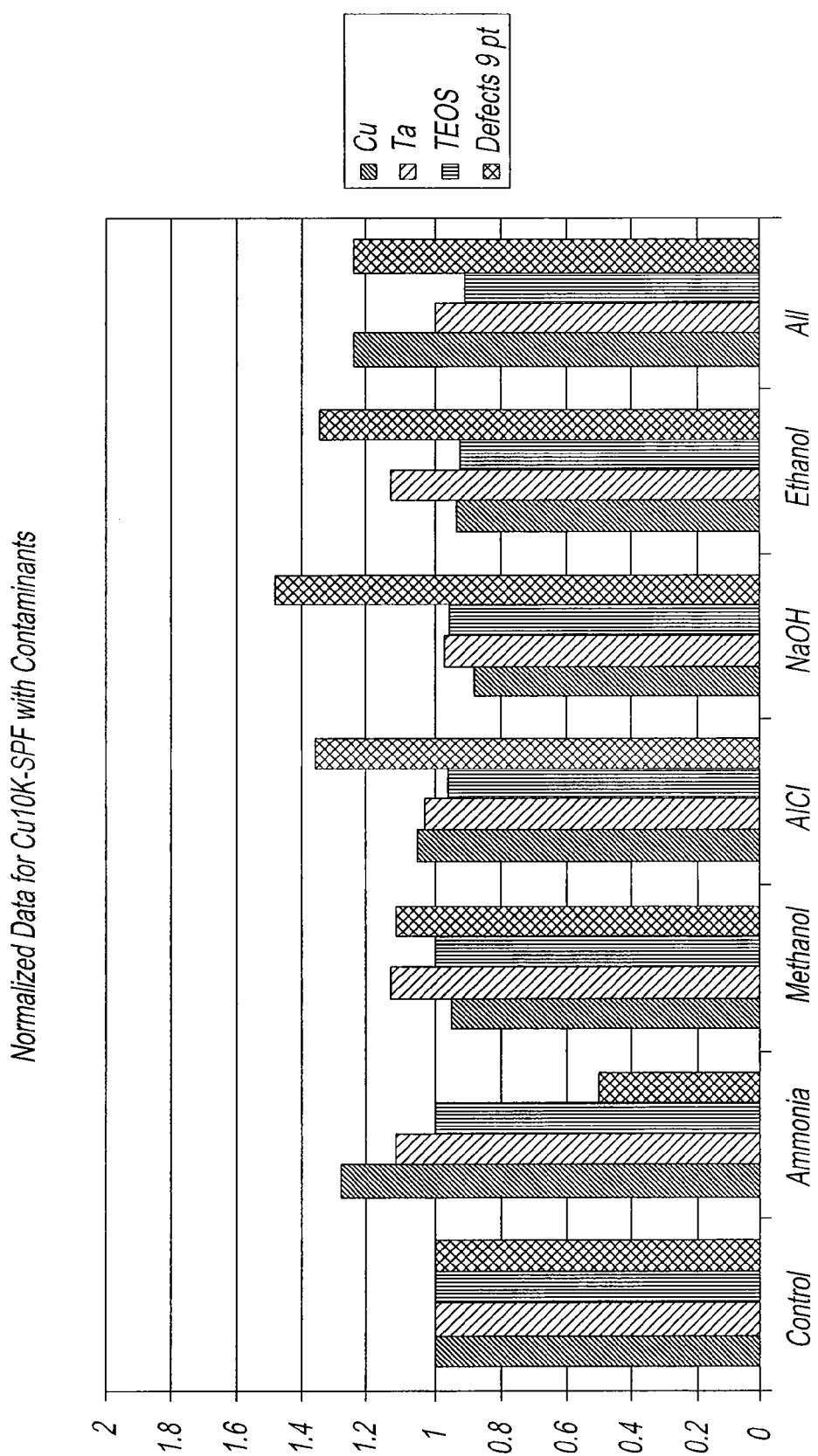
FIG. 5 is graph plotting normalized data for polishing Cu10K-SPF with contaminants.
Figure 6:
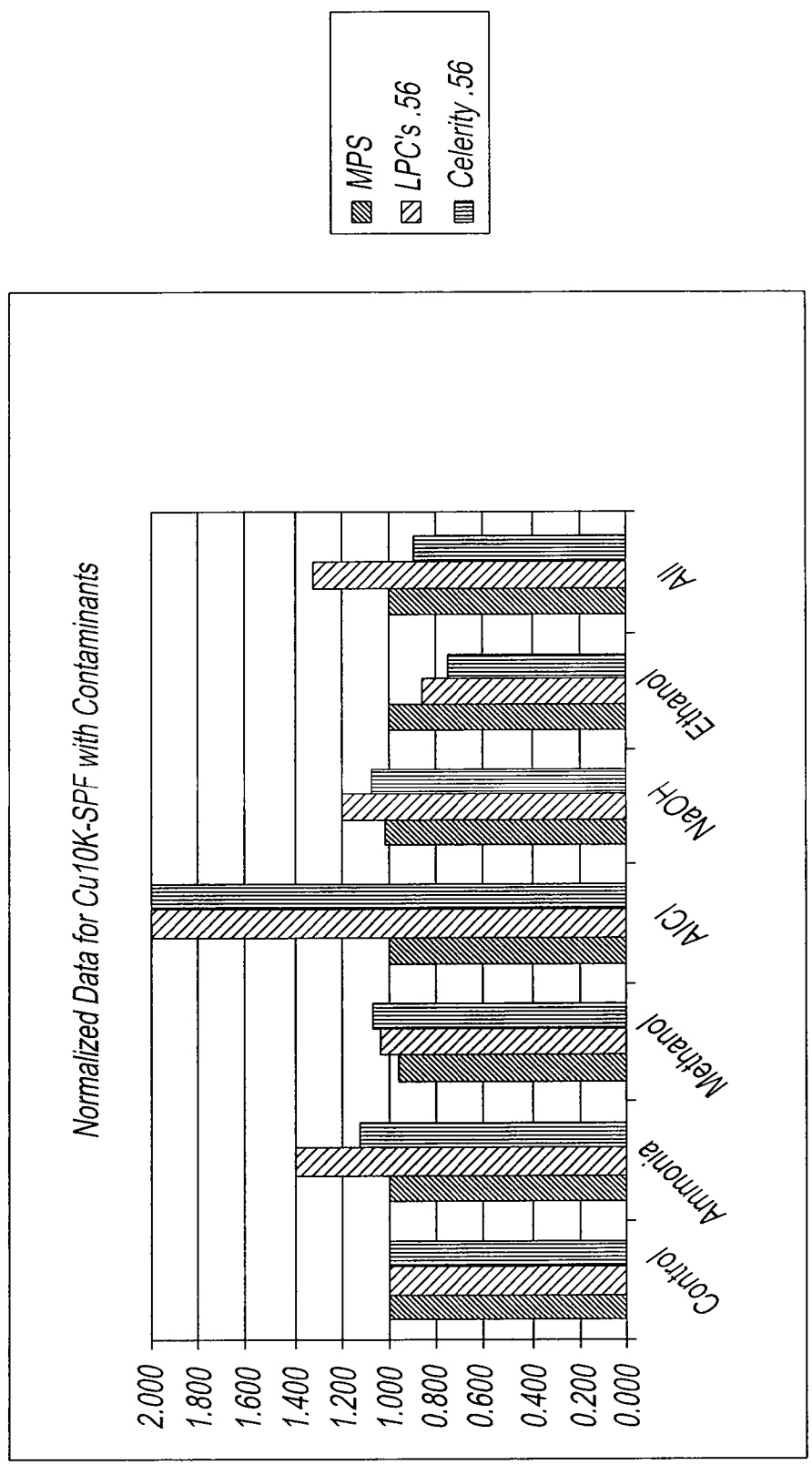
FIG. 6 is a graph plotting normalized data for Cu10K-SPF with contaminants.

FIGS. 5 and 6 attached hereto, provide data when Cu10K-SPF was a control and wherein fixed amounts of ammonia (100 ppm), alumina (5 ppm), methanol (150 ppm), NaOH (5 ppm), ethanol (150 ppm) and a mixture of contaminants were added and then various properties were tested. The first set of data shows normalized data for polishing Cu, Ta, TEOS and defects. These tests demonstrated that copper removal rate increased with ammonia addition, and defects decreased. Not much change with methanol samples was observed. The aluminum chloride sample showed higher defects than the control. The NaOH gave much higher defects, as did the ethanol sample. And the sample with all contaminants gave slightly higher copper removal rate and defects.

For MPS and LPC's, the only sample that gave huge numbers was the AlCl sample, LPC's were very high for both Accusizer and C-LPGs. MPS was not affected much by any sample.

Figure 7:
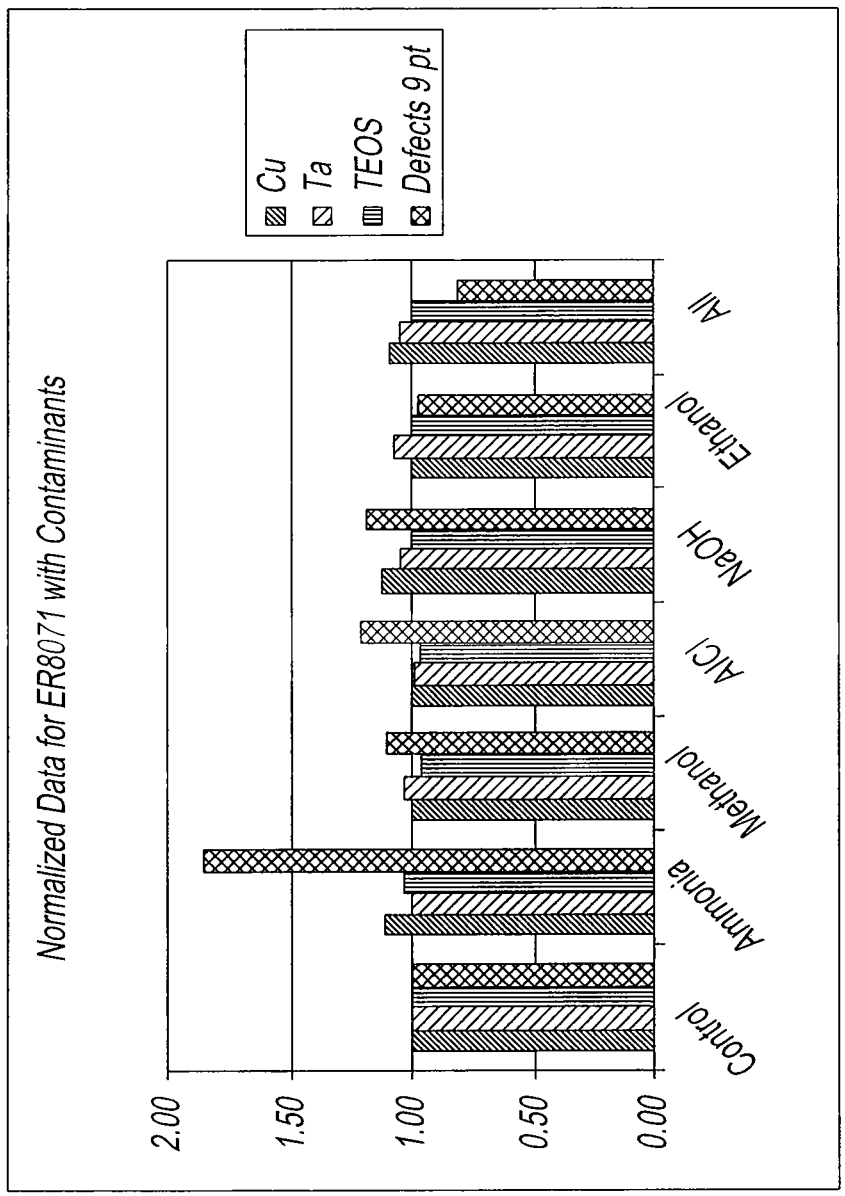
FIG. 7 is a graph plotting data for polishing ER8071 with contaminants.
Figure 8:
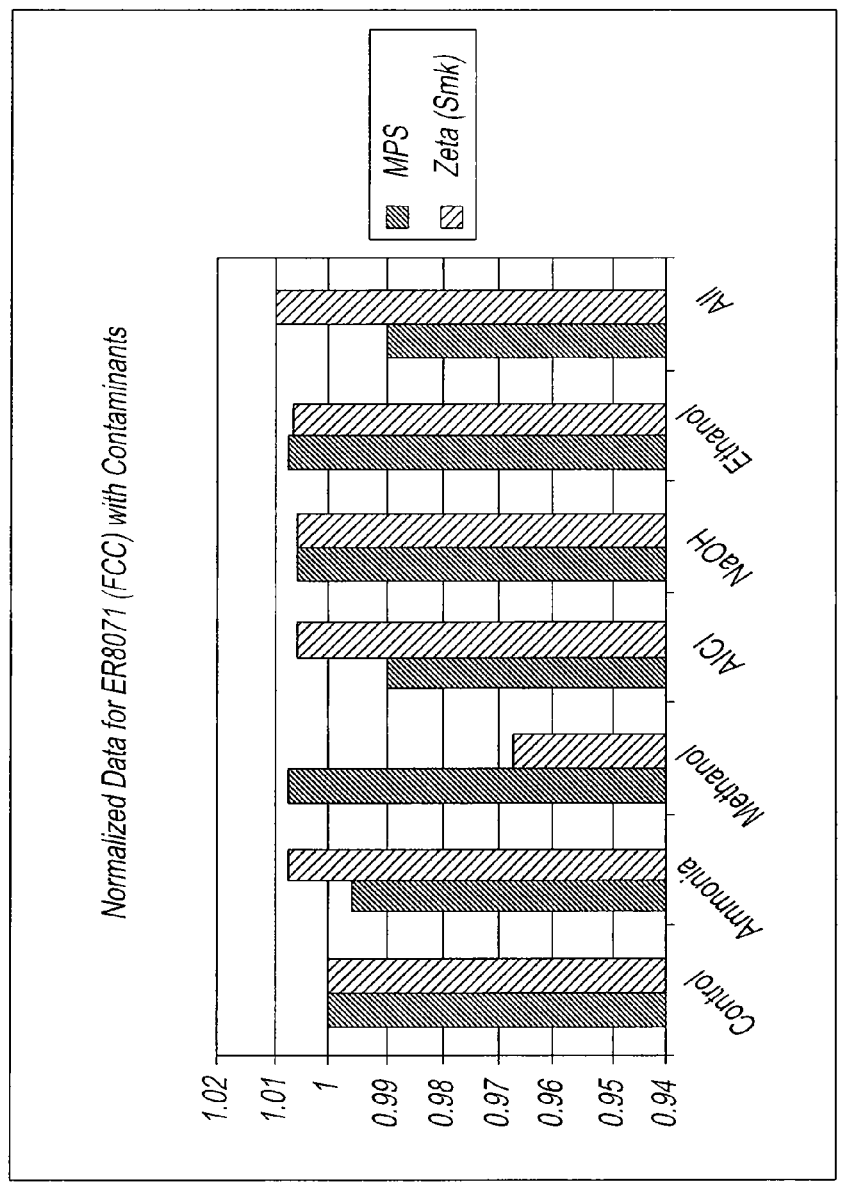
FIG. 8 is a graph plotting ER8071 Slurry with contaminants.

FIGS. 7 and 8, attached hereto, provide data when ER8071 slurry was used and wherein fixed amounts of ammonia (100 ppm), alumina (5 ppm), methanol (150 ppm), NaOH (5 ppm), ethanol (150 ppm) and a mixture of contaminants were added and then various properties were tested. As far as the FCC/ER8071 samples go there was a lot less affected. The defects were very high with the addition of ammonia, and lower defects with the 'worse case' sample. The rates did not seem to change much.

MPS and Zeta seem to be impacted on this normalized graph, but the actual numbers do not vary much. Review of the scale demonstrates that the FCC particle was not affected much by the contaminants, including even the 'worse case' which is methanol zeta is −28.1 versus the control of −29.1.

The fumed silica samples are undesirable as far as LPC's. Defectivity and copper rates are the main factors affected by polishing samples with contaminants.

When contaminants are added, the FCC particle is not influenced much when running Nicomp and colloidal dynamics. FCC particles with contaminants may cause defectivity to increase, but rates generally remain constant.

Example 3

Figure 9:
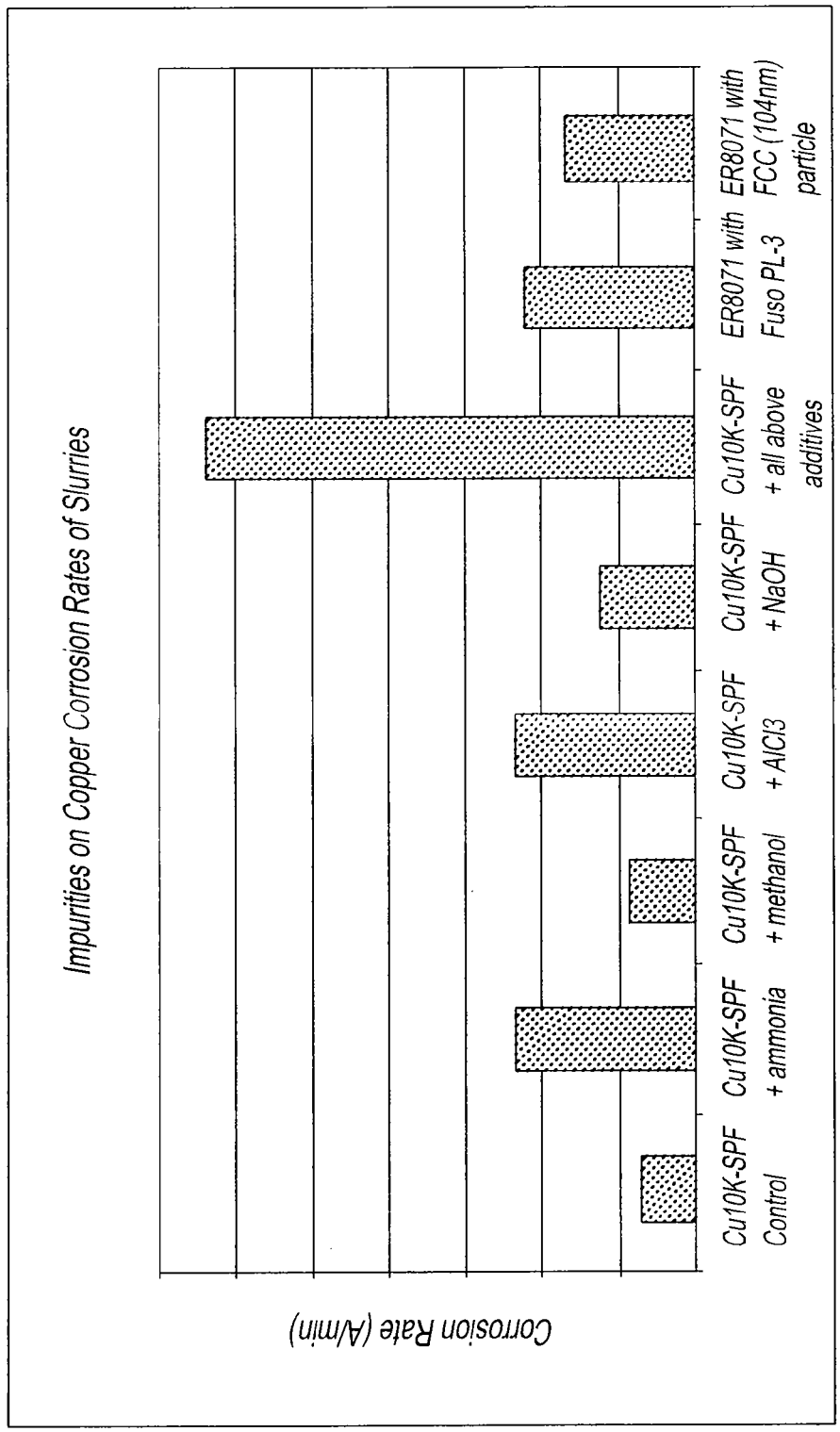
FIG. 9 is a graph plotting corrosion rates of Cu10K-SPF and ER8071 samples.
Figure 10:
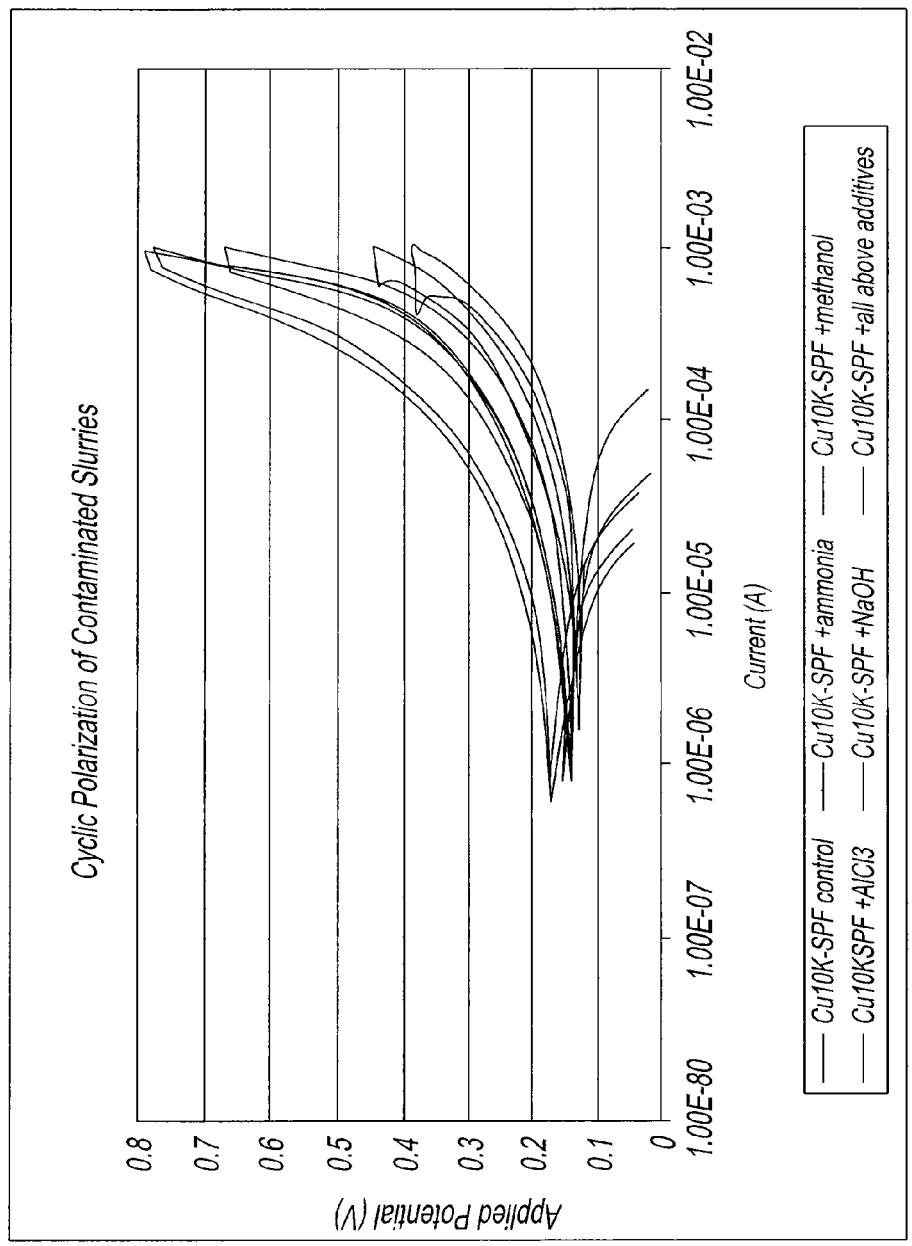
FIG. 10 is a graph plotting cyclic polarization comparison of contaminated Cu10K-SPF samples.
Figure 11:
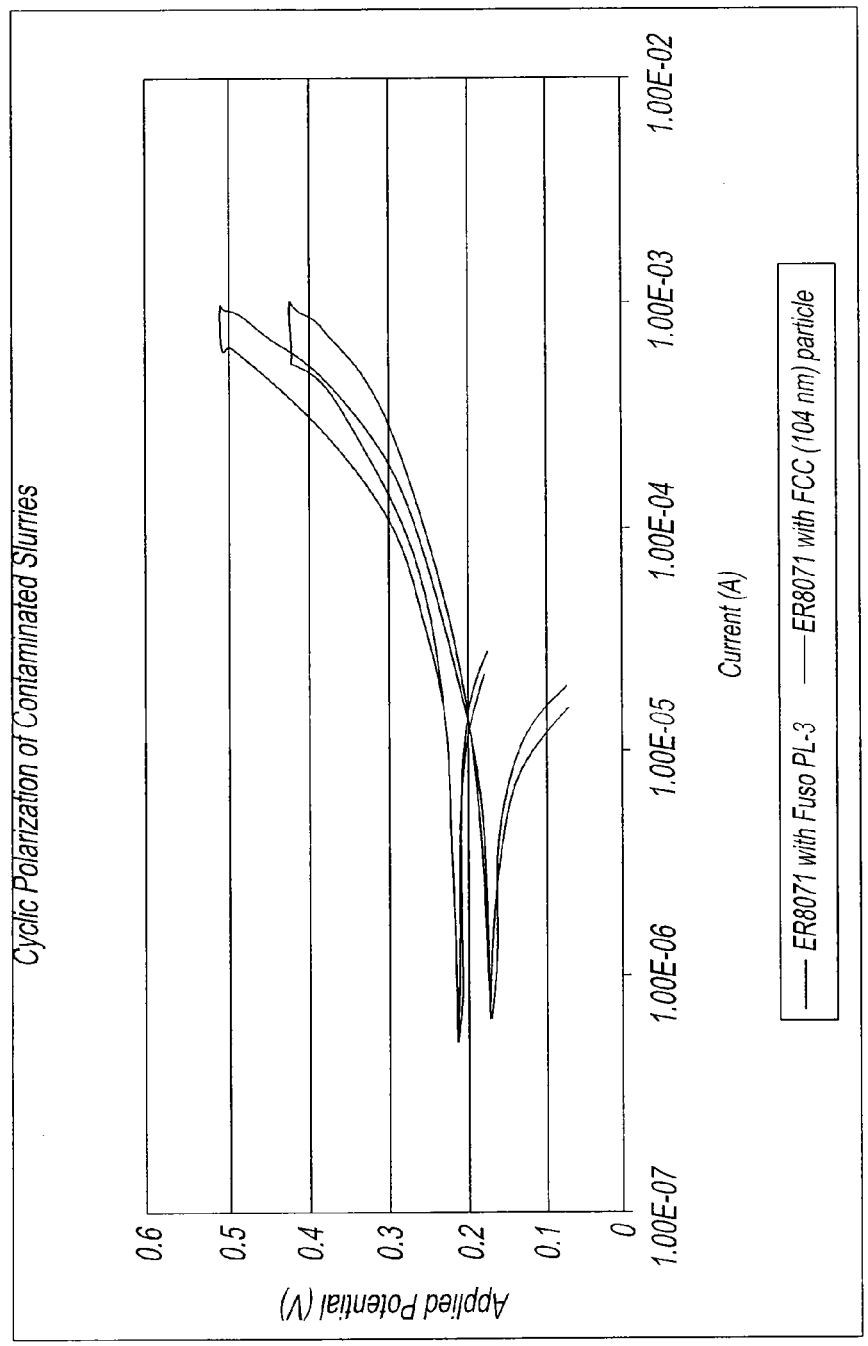
FIG. 11 is a graph plotting cyclic polarization comparison of ER8071 samples.

FIG. 9-11 depict the effects of impurities in Cu10K-SPF and ER8071 on their respective copper corrosion characteristics.

The samples in the figures included a Cu10K-SPF as the control, the control contaminated with 100 ppm (wt/wt) ammonium hydroxide, 150 ppm (wt/wt) methanol, 5 ppm (wt/wt) aluminum chloride, 5 ppm (wt/wt) sodium hydroxide respectively, and one control included all the above contaminants together. The two ER8071 samples were with identical chemistry, only different on the abrasive particles: one with a TMOS based colloidal silica which is known to have less than 200 ppb individual trace metals but with certain levels of alcohol and ammonia impurities, the other with a type of FCC colloids.

FIG. 9 shows the corrosion rates calculated using the Stern-Geary equation based on data acquired with linear polarization and the Tafel plots of the samples. Both ammonia and aluminum chloride more than doubled the corrosion rate of the Cu10K-SPF slurry. Addition of all the aforementioned contaminants together had led to synergetic increase of copper corrosion rate and deterioration of passivation protection (see FIG. 10).

FIG. 11 is the cyclic polarization comparison of the two ER8071 samples. It displayed the decrease of corrosion protection on copper surface when the TMOS based abrasives were used, in agreement with the corrosion rate calculation (FIG. 9).

The present inventors have unexpectedly discovered that tiny amounts of impurities can have a significant effect on removal rates, LPC's and defectivity, and that ultrapure slurries, according to the present invention, have better overall performance than conventional slurries.

In another embodiment, the present invention provides a method of chemical mechanical polishing a substrate. The method includes the step of contacting the substrate and a composition having a plurality of colloidal silica particles according to the present invention and a medium for suspending the particles. The contacting is carried out at a temperature and for a period of time sufficient to planarize the substrate.

The particles can be suspended or dispersed in a variety of mediums to produce a polishing composition. For example, the particles may proportionately include a greater concentration of larger size or primary particles, with a lesser concentration of smaller size or secondary particles. The result of this size variation is an improved removal rate of surface impurities and controlled surface topography not provided by conventional polishes.

The composition can further include an additive selected from a carboxylic acid or a mixture of carboxylic acids present in a concentration of about 0.01 wt % to about 0.9 wt %; an oxidizer, present in a concentration of about 10 ppm to about 250,000 ppm and preferably, present in a concentration of about 10 ppm to about 1000 ppm; and a corrosion inhibitor, present in the range of about 10 ppm to about 1000 ppm.

In a preferred embodiment the composition includes primary particles having a mean particle size from about 2 nm to about 200 nm.

The composition can be in the form of an emulsion, a colloidal suspension, a solution, and a slurry in which the particles are uniformly dispersed and are stable both in a basic or acidic pH environment and includes a surfactant.

In a preferred embodiment, the composition can include a cationic, anionic, non-ionic, amphoteric surfactant or a mixture thereof. More preferably, the composition includes a non-ionic surfactant, used to significantly reduce surface removal rates to about 50 ppm. The preferred non-ionic surfactant is an alkoxylated non-ionic surfactant.

The beneficial effects of the surfactants include a reduction in polishing friction.

Preferably an upper limit of about 1000 ppm because at this level, organic residue, defectivity is observed on the wafer surfaces. Therefore, a non-ionic surfactant is preferred because of its inert reactivity towards other films, such as those having Cu and Ta.

The particles in the composition also have a low level of trace metals, such as, Fe, Al, Li, Rb, Cs, and Fr. Preferably, the colloidal silica particles have a total metals concentration of about 300 ppm or less. The metals can be Fe, Al, Li, Rb, Cs, Fr, or any combinations thereof. More preferably, the concentration of these metals is about 10 ppm or less. Most preferably, the concentration of these metals is about 2 ppm or less, except for K, which can be used as stabilizer, or Na.

Preferably, silica particles having surface area from about 20 $m^2$/g to about 300 $m^2$/g are from about 1 wt % to 20 wt % of the total weight of the composition and the medium is about 81 wt % to 99 wt % of the composition.

As described above, the medium can be water, an alkaline solution, an organic solvent or a mixture thereof. The medium can be in the form of an emulsion, colloidal suspension, or slurry.

The medium of the polishing composition can include an aqueous organic solvent, such as, an aqueous alcohol, an aqueous ketone, an aqueous ether, an aqueous ester, or a combination thereof.

The preferred medium is an aqueous alcohol, wherein the alcohol preferably is methanol, ethanol, propanol, butanol, ethylene glycol, propylene glycol, or a mixture thereof.

The medium can be the same as or different from the aqueous organic solvent typically employed in the process of manufacturing a colloidal silica dispersion according to the present invention. The colloidal silica dispersion can be used as the chemical mechanical polishing composition without isolating the colloidal silica particles from the colloidal silica dispersion.

The pH of the polishing composition is maintained in a range from about 9.0 to about 11 or in acidic region of about 2.0 to about 4.0.

The present invention also encompasses particular made from dehydrated slurries.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A method for preparing an ultrapure colloidal silica dispersion, comprising the steps of:
   dissolving a fumed silica in an aqueous solvent comprising an alkali metal hydroxide to produce an alkaline silicate solution;
   removing the alkali metal via ion exchange to generate a silicic acid solution; and
   adjusting temperature, concentration and pH of said silicic acid solution to values sufficient to initiate nucleation and particle growth; and
   cooling said silicic acid solution at a rate sufficient to produce said colloidal silica dispersion,
   wherein said colloidal silica dispersion has less than 200 ppb of each trace metal impurity disposed therein, excluding potassium and sodium, wherein said trace metal is selected from the group consisting of Fe, Al, Li, Rb, Cs, Fr, or any combinations thereof, and
   wherein said colloidal silica dispersion has less than 2 ppm residual alcohol.

2. The method of claim 1, wherein said ultrapure colloidal silica dispersion comprises colloidal silica particles having a mean or aggregate particle size from about 10 to about 200 nm.

3. The method of claim 1, wherein each said trace metal is present in said dispersion in a range from about 5 to about 200 ppb, excluding potassium and sodium.

4. The method of claim 1, wherein the pH of said ultrapure colloidal dispersion is between 9 and 11.

5. The method of claim 1, wherein the pH of said ultrapure colloidal dispersion is between 2 and 4.

6. The method of claim 2, wherein said colloidal silica particles have a surface area from about 20 $m^2$/g to about 300 $m^2$/g.

7. The method of claim 2, wherein said ultrapure colloidal dispersion further comprises a medium for suspending said colloidal silica particles, wherein said medium is selected from the group consisting of water, an organic solvent and a mixture thereof.

* * * * *